(12) United States Patent
Westerlund et al.

(10) Patent No.: US 10,908,186 B2
(45) Date of Patent: Feb. 2, 2021

(54) MONITORING ARRANGEMENT FOR MONITORING A SURGE ARRESTER AND METHOD FOR ESTABLISHING MONITORING DATA RELATED TO A SURGE ARRESTER

(71) Applicant: ABB Power Grids Switzerland AG, Baden (CH)

(72) Inventors: Håkan Westerlund, Svärdsjö (SE); Lennart Stenström, Ludvika (SE)

(73) Assignee: ABB POWER GRIDS SWITZERLAND AG, Baden (CH)

( * ) Notice: Subject to any disclaimer, the term of this patent is extended or adjusted under 35 U.S.C. 154(b) by 419 days.

(21) Appl. No.: 16/066,610

(22) PCT Filed: Dec. 9, 2016

(86) PCT No.: PCT/EP2016/080458
§ 371 (c)(1),
(2) Date: Jun. 27, 2018

(87) PCT Pub. No.: WO2017/125205
PCT Pub. Date: Jul. 27, 2017

(65) Prior Publication Data
US 2020/0271695 A1    Aug. 27, 2020

(30) Foreign Application Priority Data
Jan. 18, 2016  (EP) ..................................... 16151681

(51) Int. Cl.
*G01R 15/18*    (2006.01)
*H02H 1/00*     (2006.01)
*H02H 9/04*     (2006.01)

(52) U.S. Cl.
CPC ........... *G01R 15/18* (2013.01); *H02H 1/0007* (2013.01); *H02H 1/0092* (2013.01); *H02H 9/04* (2013.01)

(58) Field of Classification Search
CPC ......... G01R 31/50; H02H 1/0092; H02H 9/04
See application file for complete search history.

(56) References Cited

U.S. PATENT DOCUMENTS 4,706,016 A    11/1987  Schweitzer, Jr.
6,628,113 B2    9/2003  Gallavan
(Continued)

FOREIGN PATENT DOCUMENTS

CN    101102041 A    1/2008
EP    0164193 A1    12/1985
(Continued)

OTHER PUBLICATIONS

European Search Report Application No. EP 16 15 1681.0 Completed: Aug. 10, 2016 10 pages.
(Continued)

*Primary Examiner* — Alvaro E Fortich
(74) *Attorney, Agent, or Firm* — Sage Patent Group (57)    ABSTRACT

A monitoring arrangement for monitoring a surge arrester which is connected to a live wire of a power network at a connection point in order to protect an electrical apparatus against incoming surges, the monitoring arrangement including: an analogue measuring circuit for sensing a current impulse through the surge arrester caused by an incoming surge in the live wire and producing a corresponding analogue measuring signal; an analog-to-digital converter for converting the measuring signal into digital signals; and an electronic processing device configured: to establish, based on the digital signals, a voltage peak value representing the highest voltage at the connection point
(Continued)

during the incoming surge; and to establish, based on the voltage peak value and by means of a calculation model or look-up table, a maximum-voltage value representing an estimated maximum voltage across the electrical apparatus during the incoming surge.

21 Claims, 3 Drawing Sheets

(56) References Cited

U.S. PATENT DOCUMENTS

| | | | |
|---|---|---|---|
| 6,879,479 B2 | 4/2005 | Colombo et al. | |
| 7,005,863 B2 * | 2/2006 | Gudmundsson | H02H 3/048 324/530 |
| 8,611,062 B2 | 12/2013 | Bishop et al. | |
| 2003/0043525 A1 | 3/2003 | Ryman | |
| 2004/0066598 A1 * | 4/2004 | Gudmundsson | H02H 3/048 361/118 |
| 2005/0264972 A1 | 12/2005 | Boulesteix et al. | |
| 2011/0096445 A1 * | 4/2011 | Truong | H02M 1/32 361/18 |

FOREIGN PATENT DOCUMENTS

| | | |
|---|---|---|
| EP | 2287989 A1 | 2/2011 |
| JP | 2000321318 A | 11/2000 |
| WO | 2015055233 A1 | 4/2015 |

OTHER PUBLICATIONS

International Preliminary Report on Patentability Application No. PCT/EP2016/080458 dated May 8, 2018 10 pages.

International Search Report and Written Opinion of the International Searching Authority Application No. PCT/EP2016/080458 Completed: Feb. 28, 2017; dated Mar. 20, 2018 15 pages.

Written Opinion of the International Searching Authority Application No. PCT/EP2016/08045 dated Jan. 4, 2018 8 pages.

Chinese Office Action dated Jan. 3, 2020 (9 pages CN-language; 2 pages EN-language) for corresponding CN 2016800792633.

* cited by examiner

MONITORING ARRANGEMENT FOR MONITORING A SURGE ARRESTER AND METHOD FOR ESTABLISHING MONITORING DATA RELATED TO A SURGE ARRESTER

TECHNICAL FIELD

The present invention relates to a monitoring arrangement for monitoring a surge arrester connected to a live wire of a power network. The invention also relates to a method for establishing monitoring data related to such a surge arrester.

BACKGROUND

Unscheduled shutdowns in a power network normally cause a large loss of income to the network operator. When a shutdown is caused by damaged or malfunctioning network components, there will also be additional costs for replacement and/or repair of said network components. Different types of surge arresters may be used in a power network in order to protect equipment against transient overvoltages caused by surges occurring in the power network. A surge arrester is normally connected between a live wire of a power network and ground in order to protect an electrical apparatus of the power network against excessive overvoltages caused by incoming surges in the live wire. The surge arrester may be designed as a gapless surge arrester with series connected zinc oxide varistors. When the voltage in the live wire reaches a certain level in connection with an incoming surge, the surge arrester will allow electric current to be conducted from the live wire to ground with low resistance, and the electrical apparatus protected by the surge arrester is thereby prevented from being subjected to an excessive overvoltage.

The number of surges or overvoltages a surge arrester is subjected to may be recorded by means of a so-called surge counter, which is connected to the grounding cable of the surge arrester. The surge counter gives information about the extent to which the installation is subjected to overvoltages and serves as a monitoring device for the surge arrester. The surge counter is normally sensitive to the charge content or amplitude of the impulse current through the surge arrester caused by an incoming surge in the live wire to which the surge arrester is connected, and the counting function of the surge counter is activated when certain predetermined values with respect to the amplitude and/or duration of an electric current impulse are exceeded.

A monitoring arrangement according to the prior art is previously known from U.S. Pat. No. 6,879,479 B2. This monitoring arrangement comprises an inductive sensing member in the form of a toroidal current transformer for sensing current impulses passing through a conductor between a surge arrester and ground and producing analogue measuring signals representing such current impulses. These analogue measuring signals are converted into digital signals by means of an analog-to-digital converter. The monitoring arrangement disclosed in U.S. Pat. No. 6,879,479 B2 further comprises processing means for analysing the digital signals in order to establish the duration of a detected current impulse, and processing means for establishing, based on the duration of the detected current impulse, whether the detected current impulse is related to an overvoltage caused by lightning or an overvoltage caused by switching operations.

SUMMARY

The object of the present invention is to achieve a surge arrester monitoring arrangement of new and favourable configuration, which in at least some aspect offers an advantage as compared to previously known surge arrester monitoring arrangements.

According to the invention, said object is achieved by means of a monitoring arrangement having the features of the invention.

The monitoring arrangement of the present invention is to be used for monitoring a surge arrester which is connected to a live wire of a power network at a connection point on the live wire in order to protect an electrical apparatus of the power network against incoming surges. This monitoring arrangement comprises:

- a conductor element, which is configured to be electrically connected to ground and to the surge arrester so that electric current impulses passing through the surge arrester will pass through this conductor element;
- an analogue measuring circuit for sensing current impulses passing through the conductor element and producing analogue measuring signals representing such current impulses;
- an analog-to-digital converter connected to the analogue measuring circuit and configured to sample the analogue measuring signals from the analogue measuring circuit in order to convert these analogue measuring signals into digital signals; and
- an electronic processing device for receiving said digital signals from the analog-to-digital converter and producing monitoring data based on these digital signals.

The monitoring arrangement is characterized in:

- that the electronic processing device is configured to establish, based on digital signals produced by the analog-to-digital converter for a current impulse through the surge arrester caused by an incoming surge in the live wire, a voltage peak value representing the highest voltage at said connection point during the incoming surge; and
- that the electronic processing device is configured to establish, based on said voltage peak value and by means of a calculation model or look-up table, a maximum-voltage value representing an estimated maximum voltage across the electrical apparatus during the incoming surge in question.

The maximum-voltage values established by the electronic processing device will give the power network operator an indication about the overvoltage levels that the protected electrical apparatus has been subjected to and may be subjected to in the future. Based on this information, the power network operator may decide whether or not the protection of the electrical apparatus needs to be improved, for instance by increasing the number of surge arresters, moving an existing surge arrester closer to the electrical apparatus or replacing an existing surge arrester by a new surge arrester with better protection performance.

Further advantages as well as advantageous features of the monitoring arrangement according to the invention will appear from the following description and the dependent claims.

The invention also relates to a method for establishing monitoring data related to a surge arrester.

Further advantages as well as advantageous features of the method according to the invention will appear from the following description and the dependent claims.

BRIEF DESCRIPTION OF THE DRAWINGS

The invention will in the following be more closely described by means of embodiment examples, with reference to the enclosed drawings. In the drawings.

DETAILED DESCRIPTION

Figure 1:
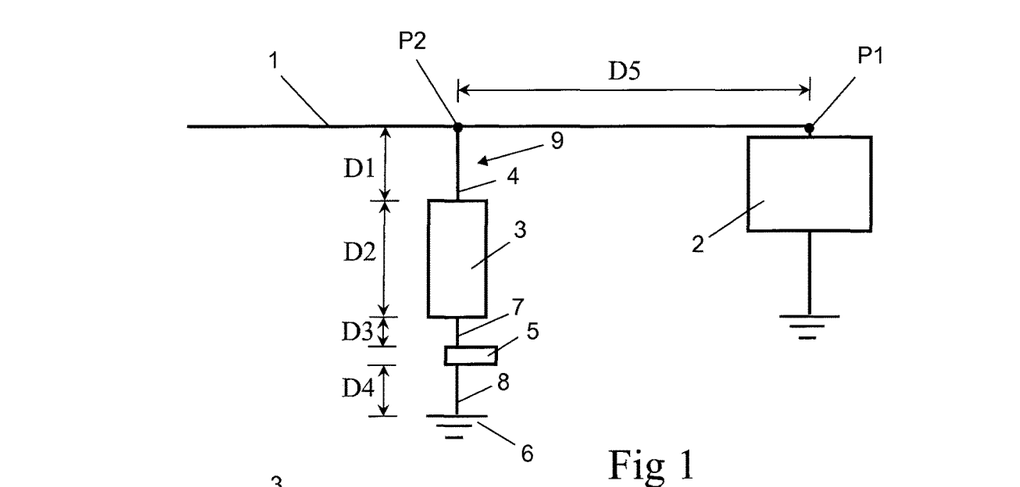
FIG. 1 is an outline diagram of a part of a power network comprising a monitoring arrangement according to the present invention.

FIG. 1 very schematically illustrates a part of a power network comprising a live wire 1 and an electrical apparatus 2, for instance in the form of a power transformer, connected to the live wire 1 at a first connection point P1 on the live wire. A surge arrester 3 is connected to the live wire 1 at a second connection point P2 on the live wire 1 in order to protect the electrical apparatus 2 against incoming surges in the live wire. The surge arrester 3 is electrically connected to the live wire 1 by means of an electrical conductor 4 which extends between said second connection point P2 and the surge arrester 3. The surge arrester 3 is connected to ground via electrical conductors 7 and 8. The surge arrester 3 is a gapless surge arrester provided with a zinc oxide varistor or several series connected zinc oxide varistors. A monitoring arrangement 5 is connected to the surge arrester 3 in order to record monitoring data related to the operation and condition of the surge arrester.

Figure 2:
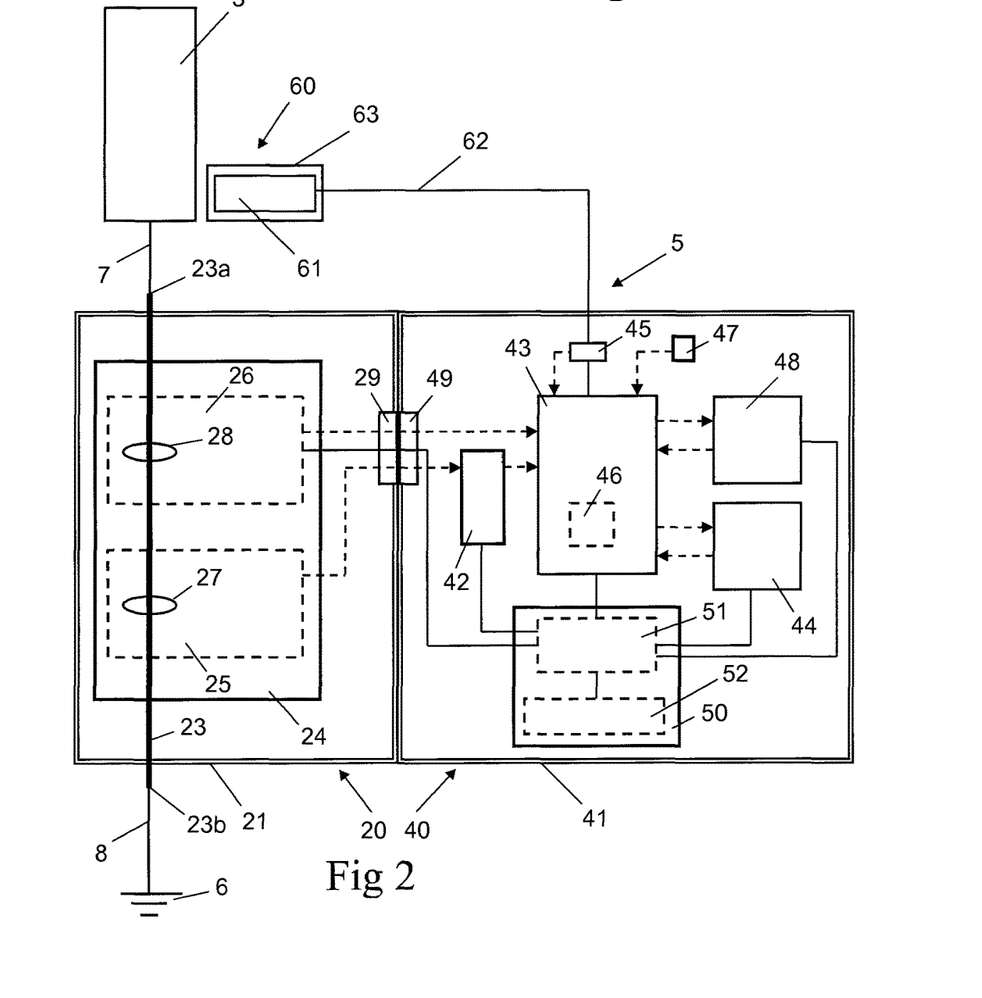
FIG. 2 is an outline diagram of a monitoring arrangement according to an embodiment of the present invention.

FIG. 2 very schematically illustrates a possible embodiment of the above-mentioned monitoring arrangement 5. The illustrated monitoring arrangement 5 comprises a base module 20 and an auxiliary module 40, the auxiliary module being detachably mountable to the base module. Each module 20, 40 comprises an external casing 21, 41, which accommodates different components of the monitoring arrangement 5. As an alternative, the monitoring arrangement 5 may of course also have a non-modularized construction with one single external casing.

Figure 3:
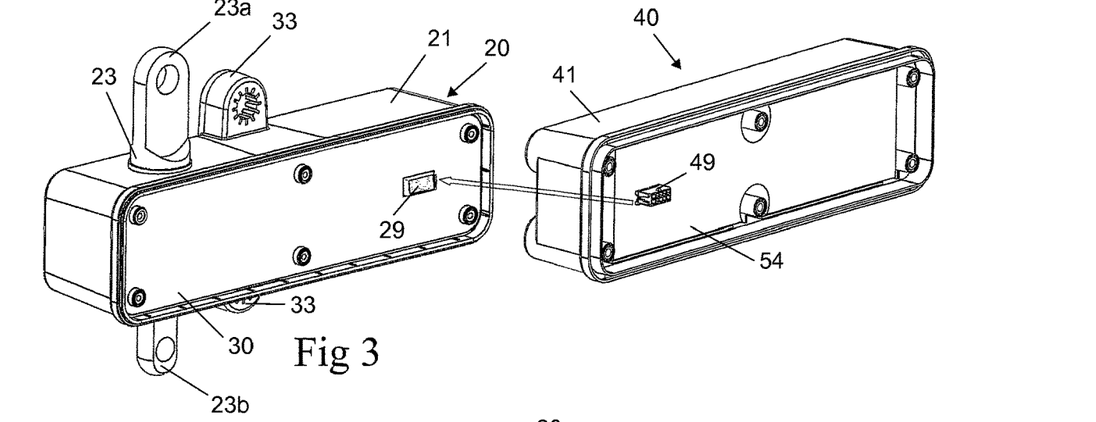
FIG. 3 is a perspective view of a base module and an auxiliary module included in a monitor arrangement according to an embodiment of the invention, with the modules separated from each other.
Figure 4:
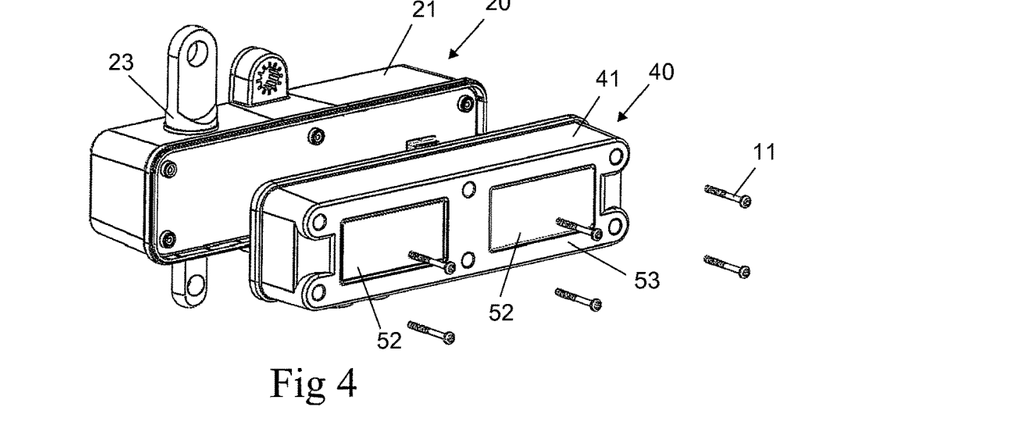
FIG. 4 is another perspective view of the base module and auxiliary module of FIG. 3.
Figure 5:
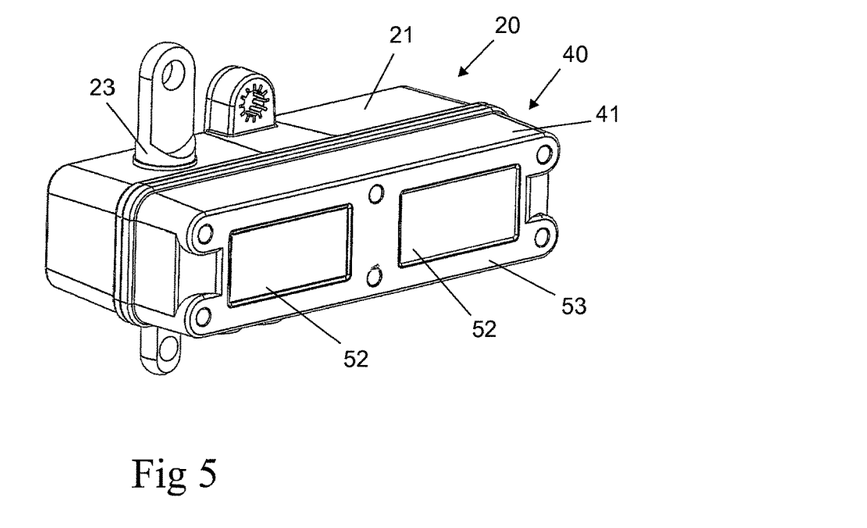
FIG. 5 is a perspective view of the base module and auxiliary module of FIGS. 3 and 4, with the auxiliary module mounted to the base module.

In the example illustrated in FIGS. 3-5, the casing 41 of the auxiliary module 40 is securable to the casing 21 of the base module 20 by means of fastening members 11 in the form of screws. The auxiliary module 40 may of course also be detachably mountable to the base module 20 in any other suitable manner.

The base module 20 comprises a conductor element 23, which extends through the casing 21 of the base module. The conductor element 23 is to be electrically connected to ground 6 and to the surge arrester 3. When the monitoring arrangement 5 is connected to the surge arrester 3, a first end 23a of the conductor element 23 is electrically connected to the surge arrester 3 by means of an electrical conductor 7 and an opposite second end 23b of the conductor element is electrically connected to ground 6 by means of another electrical conductor 8. Thus, an electric current flowing from the live wire 1 to ground 6 via the surge arrester 3 will pass through the conductor element 23. The conductor element 23 is with advantage designed as a stiff rod of a suitable metallic material and rigidly secured to the casing 21 of the base module 20, as illustrated in FIGS. 3-5.

The base module 20 also comprises a measuring unit 24, which is arranged in the casing 21 of the base module and which comprises one or more analogue measuring circuits 25, 26 for measuring the electric current passing through the conductor element 23 and producing measuring signals related to the measured electric current. In the illustrated embodiment, the measuring unit 24 comprises a first analogue measuring circuit 25 for detecting an electric current impulse in the conductor element 23 and producing an analogue measuring signal representing such a current impulse, and a second analogue measuring circuit 26 for measuring the leakage current of the surge arrester 3 and producing measuring signals representing the measured leakage current. Each measuring circuit 25, 26 preferably comprises an inductive sensing member 27, 28 for sensing the electric current passing through the conductor element 23, wherein the sensing member 27, 28 of the respective measuring circuit comprises a coil arranged around the conductor element 23.

The monitoring arrangement 5 comprises an analog-to-digital converter 42 which is connected to the first analogue measuring circuit 25 and configured to sample the analogue measuring signals from this measuring circuit 25 in order to convert the analogue measuring signals into digital signals. In the illustrated embodiment, the analog-to-digital converter 42 is arranged in the auxiliary module 40.

The monitoring arrangement 5 comprises an electronic processing device 43 for receiving the measuring signals from the second analogue measuring circuit 26 and the digital signals from the analog-to-digital converter 42 and producing monitoring data based on these signals. The electronic processing device 43 is configured to produce monitoring data related to the current impulses detected by the first analogue measuring circuit 25 and monitoring data representing the leakage current measured by the second analogue measuring circuit 26. The monitoring arrangement 5 also comprises a data storage medium 44 for storing the monitoring data produced by the electronic processing device 43. Input and writing of data in the data storage medium 44 is controlled by the electronic processing device 43. The data storage medium 44 is for instance a memory of the type ROM, PROM, EPROM or EEPROM. The electronic processing device 43 is also responsible for the control of other components included in the monitoring arrangement 5. In the illustrated embodiment, the electronic processing device 43 and the data storage medium 44 are arranged in the auxiliary module 40.

In the illustrated embodiment, the analog-to-digital converter 42 and the electronic processing device 43 is connected to the first analogue measuring circuit 25 and to the second analogue measuring circuit 26, respectively, via a connector which comprises a first connector member 29 provided in the base module 20 and a second connector member 49 provided in the auxiliary module 40. The first connector member 29 is connected to the measuring circuits 25, 26 of the measuring unit 24 and the second connector member 49 is connected to the analog-to-digital converter 42 and to the electronic processing device 43. The first connector member 29 is provided on a front side 30 of the base module 20 and the second connector member 49 is provided on a rear side 54 of the auxiliary module 40. The second connector member 49 is configured to be engaged with the first connector member 29 when the auxiliary module 40 is mounted to the base module 20 to thereby allow the analog-to-digital converter 42 and the electronic processing device 43 to receive measuring signals from the first analogue measuring circuit 25 and the second analogue measuring circuit 26, respectively, via the first and second connector members 29, 49.

The first and second analogue measuring circuits 25, 26 are of a robust type and may be in operation for several years without requiring any maintenance or upgrade. However, the analog-to-digital converter 42 and the electronic processing device 43 comprise more advanced digital electronics, which is more sensitive and could require regular maintenance or replacement. Also the data storage medium 44 is more sensitive and could require regular maintenance or replacement. According to the illustrated embodiment, said robust analogue measuring circuits 25, 26 and said sensitive components 42, 43, 44 are arranged in two different modules 20, 40, which are easily connectable to each other and disconnectable from each other. The base module 20 comprising the analogue measuring circuits 25, 26 may remain connected to the surge arrester 3 when the auxiliary module 40 comprising the analog-to-digital converter 42, the electronic processing device 43 and the data storage medium 44 is disconnected from the base module 20 and thereby from the surge arrester 3. Hereby, the auxiliary module 40 may be temporarily detached from the base module 20 in order to allow maintenance or replacement of the sensitive components in the auxiliary module, without requiring any interruption of the power distribution in the power network to which the surge arrester 3 is connected.

In the embodiment illustrated in FIG. 2, the monitoring arrangement 5 comprises a field probe 61, which is connected to ground and configured to generate an electric current under the influence of the electric field of the power network to which the surge arrester 3 is connected. In this case, the monitoring arrangement 5 comprises a third measuring circuit 45 for measuring the electric current generated by the field probe 61, i.e. the electric current flowing between the field probe 61 and ground, and producing measuring signals representing the measured electric current. The electronic processing device 43 is configured to produce monitoring data representing the electric current measured by the third measuring circuit 45. The data storage medium 44 is configured to store the monitoring data representing the leakage current measured by the second measuring circuit 26 and the monitoring data representing the electric current measured by the third measuring circuit 45 associated to time information generated by means of a clock circuit 46 so that this monitoring data can be related to specific points of time. It is hereby, in the manner described in U.S. Pat. No. 7,005,863 B2, possible to calculate a value of the resistive leakage current through the surge arrester 3 based on the monitoring data stored on the data storage medium 44. Said clock circuit 46 may be included in the auxiliary module 40 and for instance form part of the electronic processing device 43, as illustrated in FIG. 2. As an alternative, the auxiliary module 40 may receive time information from an external clock circuit through a wireless connection or a cable connection.

The field probe 61 may consist of a plate of electrically conductive material, such as aluminium. The field probe 61 is to be located at a place where the electric field from the power network is sufficiently strong, and it should have a relatively large surface in order to be able to be effectively influenced by said electric field. The field probe 61 is with advantage provided in a separate module 60, which is connected to the auxiliary module 40 by means of an electrical conductor 62, as illustrated in FIG. 2. The field probe 61 may be connected to ground via the electronic processing device 43, as illustrated in FIG. 2. In this case, the above-mentioned third measuring circuit 45 is included in the auxiliary module 40. As an alternative, the field probe 61 may be connected to the base module 20 by means of an electrical conductor. In the latter case, the above-mentioned third measuring circuit 45 may be included in the base module 20. The field probe 61 is with advantage enclosed in a protective casing 63.

The auxiliary module 40 is with advantage provided with a temperature sensor 47 for measuring the ambient temperature. The electronic processing device 43 is connected to the temperature sensor 47 in order to receive measuring signals from the temperature sensor as to the ambient temperature. The data storage medium 44 is configured to store temperature information generated by means of the temperature sensor 47 associated to time information generated by means of the clock circuit 46. Hereby, the monitoring data related to the electric current passing through the conductor element 23 and the monitoring data related to the electric current generated by the field probe 61 can be associated with the temperature that prevailed at the measuring occasion.

The auxiliary module 40 preferably comprises a communication unit 48 for wireless transmission of monitoring data stored on the data storage medium 44 to a reading unit (not shown). Hereby, a remote-controlled reading of data stored on the data storage medium 44 is possible. The communication unit 48 may be configured to communicate with the reading unit in the manner described in closer detail in U.S. Pat. No. 7,005,863 B2. The communication unit 48 may comprise a radio transceiver for communicating with the reading unit. It is of course also possible to use any other suitable technique for the wireless communication between the communication unit 48 and the reading unit. The communication unit 48 and the reading unit are suitably adapted for bi-directional communication so that the communication unit 48 of the auxiliary module 40 can transmit monitoring data to the reading unit as well as receive control instructions from the reading unit. The operation of the communication unit 48 is controlled by the electronic processing device 43. As an alternative to wireless transmission, the transfer of monitoring data from the auxiliary module 40 and the supply of control instructions to the auxiliary module could take place via a cable, for instance an optical cable, or an optical fibre. The reading unit may be a portable, hand-held unit, which is temporarily connected to the auxiliary module 40 when a reading of monitoring data is to take place, as described in U.S. Pat. No. 7,005,863 B2. However, the auxiliary module 40 may also be permanently connected to a monitoring centre.

The auxiliary module 40 also comprises a power supply unit 50, which is responsible for the supply of electric current to the analog-to-digital converter 42, the electronic processing device 43, the data storage medium 44, the communication unit 48, the second analogue measuring circuit 26 and any other possible component of the monitoring arrangement 5 that requires supply of electric current. In the illustrated embodiment, the power supply unit 50 is connected to the second analogue measuring circuit 26 via the first and second connector members 29, 49. The power supply unit 50 preferably comprises an energy storage member 51, for instance in the form of a supercapacitor, and one or more solar cells 52 connected to the energy storage member. As an alternative, the power supply unit 50 may consist of a battery. In the embodiment illustrated in FIGS. 4 and 5, two solar cells 52 are provided on the front side 53 of the auxiliary module 40. The components of the monitoring arrangement 5 may, as an alternative, be supplied with electric current by cable from an external power source. In the latter case, no power supply unit is needed in the monitoring arrangement 5.

In the embodiment illustrated in FIGS. 3-5, the casing 21 of the base module 20 is provided with mounting lugs 33, through which the base module 20 may be secured to the stand of a surge arrester 3 by means of fastening members in the form of bolts or the similar.

Figure 6:
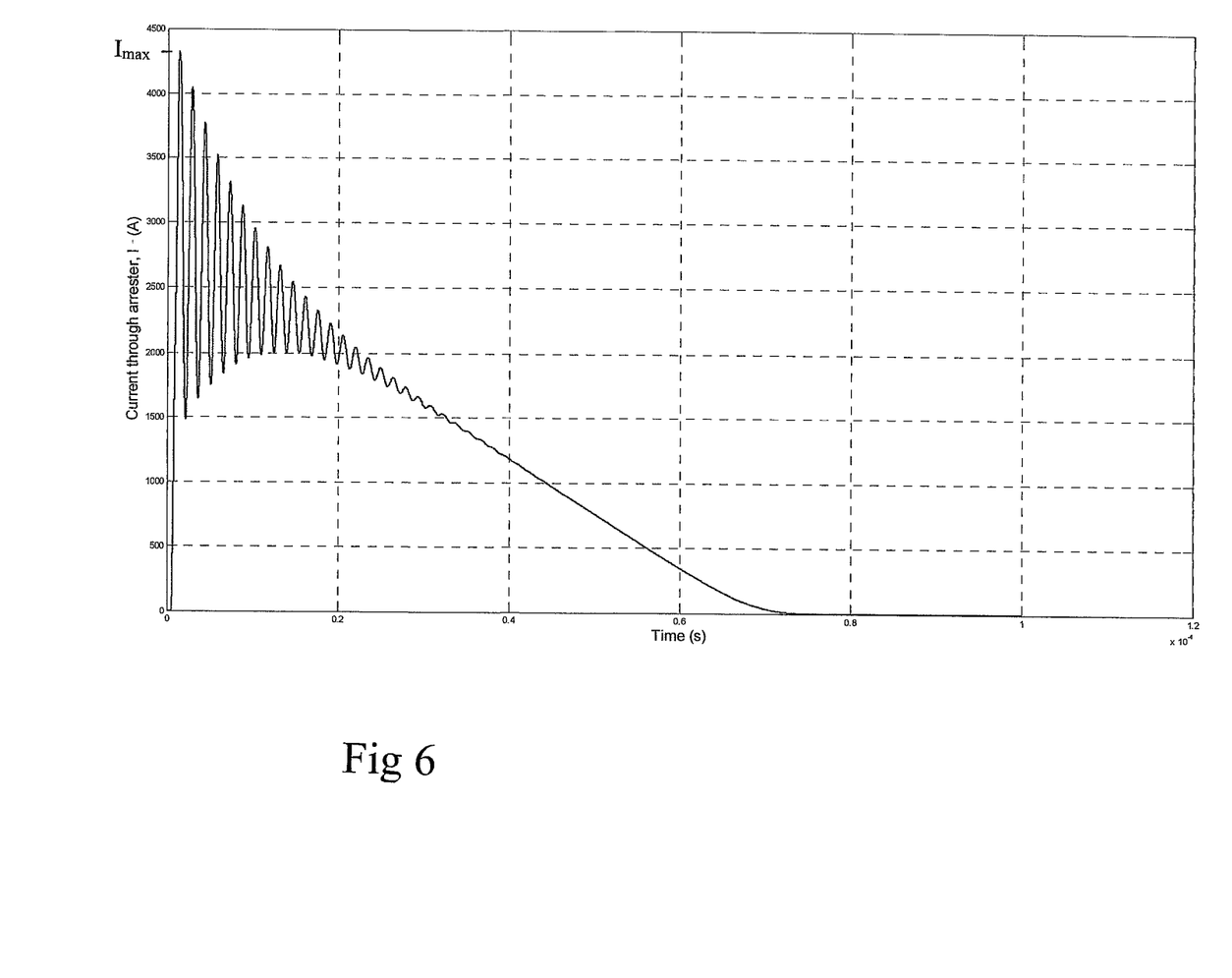
FIG. 6 is a diagram showing the amperage of a current impulse as a function of time.

When a current impulse of larger magnitude, such as for instance larger than 100 A, caused by an incoming surge in the live wire 1 passes through the surge arrester 3 this current impulse will be sensed by the inductive sensing member 27 of the first analogue measuring circuit 25, and the first analogue measuring circuit 25 will produce an analogue measuring signal representing this current impulse. The analogue measuring signal from the first analogue measuring circuit 25 is sampled by the analog-to-digital converter 42 and converted by the analog-to-digital converter 42 into digital signals representing the current impulse in question. The digital signals produced by the analog-to-digital converter 42 form a series of digital values showing how the amperage of the detected current impulse through the surge arrester 3 changes during the lapse of the current impulse. Thus, the amperage of the current impulse as a function of time may be derived from the digital signals, as illustrated in FIG. 6 where current values derived from a sequence of digital signals produced by the analog-to-digital converter 42 have been plotted along a time axis.

Based on the digital signals produced by the analog-to-digital converter 42 for a current impulse through the surge arrester 3 caused by an incoming surge in the live wire 1, the electronic processing device 43 is configured to establish a voltage peak value $U_T$ representing the highest voltage at the second connection point P2 during the incoming surge in question. The electronic processing device 43 is also configured to establish, based on said voltage peak value $U_T$ and by means of a calculation model or look-up table, a maximum-voltage value $U_{max}$ representing an estimated maximum voltage across the electrical apparatus 2 during the incoming surge in question. The maximum-voltage value $U_{max}$ established by the electronic processing device 43 may be stored on the data storage medium 44. The maximum-voltage value $U_{max}$ is intended to give an approximate indication of the overvoltage level that the electrical apparatus 2 might have been subjected to in connection with the incoming surge in question.

For a steep current impulse with a very short front time in the order of 1 µs, there will, in addition to the discharge voltage of the surge arrester 3 as given by the voltage-current characteristic of the surge arrester, be a considerable voltage drop in the electric path 9 between the second connection point P2 and ground 6 due to the inductance of the electrical conductor 4 between the live wire 1 and the surge arrester 3, the inductance of the surge arrester 3 and the inductance of the electrical conductors 7, 8 between the surge arrester 3 and ground 6. This inductance-related voltage drop $U_L$ may be established by means of the following formula:

$$U_L(t) = L \cdot \frac{d(I(t))}{dt} \quad [I]$$

where I(t) is the amperage of the current impulse through the surge arrester 3 as a function of time, and L is the total inductance of the electric path 9 from the second connection point P2 to the surge arrester 3, across the surge arrester 3 and from the surge arrester 3 to ground.

The inductance of surge arrester 3 and the inductance of the electrical conductors 4, 7, 8 included in the above-mentioned electric path 9 may be roughly estimated as 1 µH/m, i.e. 1 µH for each meter in length of the surge arrester 3 and the electrical conductors 4, 7, 8. Thus, in the example illustrated in FIG. 1, the total inductance L of the electric path 9 may be estimated as (D1+D2+D3+D4)·1 µH, where D1 is the length of the electrical conductor 4 between the second connection point P2 and the surge arrester 3, D2 is the length of the surge arrester 3, D3 is the length of the electrical conductor 7 between the surge arrester 3 and the monitoring arrangement 5 and D4 is the length of the electrical conductor 8 between the monitoring arrangement 5 and ground 6.

Thus, for a steep current impulse, the electronic processing device 43 is configured to establish the voltage peak value $U_T$ as the sum of a first voltage value $U_1$, which represents the highest discharge voltage across the surge arrester 3 during the incoming surge in question as derived from the voltage-current characteristic of the surge arrester 3, and a second voltage value $U_2$, which represents the highest inductance-related voltage drop occurring in the above-mentioned electric path 9 during the incoming surge in question. Thus, $U_T=U_1+U_2$.

The above-mentioned first voltage value $U_1$, i.e. the highest discharge voltage across the surge arrester 3 during the incoming surge in question, depends on the front time and the peak value of the detected current impulse. The electronic processing device 43 is therefore configured to establish, based on the digital signals for the current impulse, a front time value T1 and a current peak value $I_{max}$ representing the front time and the highest current, respectively, of the current impulse. Furthermore, the electronic processing device 43 is configured to establish said first voltage value $U_1$ based on the front time value T1, the current peak value $I_{max}$ and the voltage-current characteristic of the surge arrester 3.

The front time value T1 is established in a conventional manner by multiplying the time interval T between the moments when the current value, i.e. the amperage of the current impulse, rises from 10% to 90% of the current peak value $I_{max}$ by a multiplication factor of 1.25, i.e. T1=1.25·T.

The analog-to-digital converter 42 is configured to sample the analogue measuring signals from the first analogue measuring circuit 25 at a sampling frequency of 20 MHz or higher, preferably of 35-45 MHz, to thereby make it possible to establish a front time T1 shorter than 1 µs.

The electronic processing device 43 is configured to establish the above-mentioned second voltage value $U_2$, i.e. the highest inductance-related voltage drop in the electric path 9 during the incoming surge in question, based on the digital signals for the current impulse and the above-mentioned inductance value L. This may for instance be achieved by using the above-mentioned formula I to convert the above-mentioned curve of the amperage of the current impulse as a function of time into a curve of the voltage drop in the electric path 9 as a function of time, wherein the second voltage value $U_2$ is retrieved as the highest value of the last-mentioned curve.

The above-mentioned maximum-voltage value $U_{max}$ may be established by the electronic processing device 43 by means of a calculation model which converts the voltage peak value $U_T$ into the corresponding maximum-voltage value $U_{max}$ while taking the distance D5 between the first and second connection points P1, P2 into account. As an alternative, the maximum-voltage value $U_{max}$ may be established by the electronic processing device 43 by means of a look-up table. The calculation model or look-up table may of course be configured in many different manners depending on the desired accuracy of the maximum-voltage value $U_{max}$ to be retrieved on the basis of the voltage peak value $U_T$.

A set of look-up tables may be stored in a memory of the electronic processing device 43 or in a data storage medium connected to the electronic processing device, wherein each look-up table reflects the relationship between the maximum-voltage value $U_{max}$ and the voltage peak value $U_T$ for a given distance D5 between the first and second connection points P1, P2. In this case, the electronic processing device 43 is configured to select the look-up table to be used based on a stored distance value representing the prevailing distance D5 between the first and second connection points P1, P2. One favourable alternative is to establish each look-up table with the voltage peak value $U_T$ and a steepness value S as input values and with a multiplication factor P as output value, wherein the steepness value S represents the steepness of the incoming surge and may be established as the quotient between the voltage peak value $U_T$ and the front time value T1, and wherein the maximum-voltage value $U_{max}$ is established as the product of the voltage peak value $U_T$ and the multiplication factor P, i.e. $U_{max}=U_T \cdot P$. Thus, in the latter case, the look-up table will give a multiplication factor P as output value for the combination of voltage peak value $U_T$ and steepness value S established by the electronic processing device 43 based on the digital signals from the analog-to-digital converter 42. The look-up tables are established in advance by computer simulations based on a suitable calculation model with different pre-selected combinations of voltage peak values $U_T$, steepness values S, distance values D5 and capacitances of the protected electrical apparatus as input variables. When the voltage peak value $U_T$ or the steepness value S established by the electronic processing device 43 for an incoming surge in the live wire 1 deviates from the corresponding value included in the relevant look-up table, the multiplication factor P to be used may be retrieved from the look-up table by means of interpolation.

The invention is of course not in any way restricted to the embodiments described above. On the contrary, many possibilities to modifications thereof will be apparent to a person with ordinary skill in the art without departing from the basic idea of the invention such as defined in the appended claims.

The invention claimed is:

1. A monitoring arrangement for monitoring a surge arrester which is connected to a live wire of a power network at a connection point on the live wire in order to protect an electrical apparatus of the power network against incoming surges, the monitoring arrangement comprising:
   a conductor element, which is configured to be electrically connected to ground and to the surge arrester so that electric current impulses passing through the surge arrester will pass through this conductor element;
   an analogue measuring circuit for sensing current impulses passing through the conductor element and producing analogue measuring signals representing such current impulses;
   an analog-to-digital converter connected to the analogue measuring circuit and configured to sample the analogue measuring signals from the analogue measuring circuit in order to convert these analogue measuring signals into digital signals; and
   an electronic processing device for receiving said digital signals from the analog-to-digital converter and producing monitoring data based on these digital signals; wherein:
   that the electronic processing device is configured to establish, based on digital signals produced by the analog-to-digital converter for a current impulse through the surge arrester caused by an incoming surge in the live wire, a voltage peak value representing the highest voltage at said connection point during the incoming surge; and
   that the electronic processing device is configured to establish, based on said voltage peak value and by means of a calculation model or look-up table, a maximum-voltage value representing an estimated maximum voltage across the electrical apparatus during the incoming surge in question.

2. The monitoring arrangement according to claim 1, wherein the analog-to-digital converter is configured to sample the analogue measuring signals from the analogue measuring circuit at a sampling frequency of 20 MHz or higher, preferably of 35-45 MHz.

3. The monitoring arrangement according to claim 1, wherein:
   that the monitoring arrangement includes a base module and an auxiliary module detachably mountable to the base module;
   that the conductor element and the analogue measuring circuit are arranged in the base module;
   that the analog-to-digital converter and the electronic processing device are arranged in the auxiliary module;
   that the base module includes a first connector member, which is connected to the analogue measuring circuit; and
   that the auxiliary module includes a second connector member, which is connected to the analog-to-digital converter, wherein the second connector member is configured to be engaged with the first connector member when the auxiliary module is mounted to the base module to thereby allow the analog-to-digital converter to receive said analogue measuring signals from the analogue measuring circuit via the first and second connector members.

4. The monitoring arrangement according to claim 1, wherein the monitoring arrangement includes a data storage medium for storing the maximum-voltage values established by the electronic processing device.

5. The monitoring arrangement according to claim 4, wherein the monitoring arrangement includes communication unit for wireless transmission of maximum-voltage values stored on the data storage medium.

6. The monitoring arrangement according to claim 1, wherein:
   that the electronic processing device is configured to established, based on said digital signals for the current impulse, a front time value and a current peak value representing the front time and the highest current, respectively, of the current impulse; and
   that the electronic processing device is configured to take said front time value and current peak value into account when establishing the voltage peak value.

7. The monitoring arrangement according to claim 6, wherein:
   that the electronic processing device is configured to establish, based on said front time value and current peak value, a first voltage value representing the highest discharge voltage across the surge arrester during the incoming surge in question, as derived from the voltage-current characteristic of the surge arrester;

that the electronic processing device is configured to establish, based on said digital signals for the current impulse and an inductance value representing the estimated total inductance of the electric path from the connection point to the surge arrester, across the surge arrester and from the surge arrester to ground, a second voltage value representing the highest inductance-related voltage drop occurring in said electric path during the incoming surge in question; and that the electronic processing device is configured to establish the voltage peak value as the sum of the first voltage value and the second voltage value.

8. The monitoring arrangement according to claim 1, wherein:

that the electronic processing device is configured to establish a steepness value representing the steepness of the incoming surge, wherein the electronic processing device is configured to establish the steepness value as the quotient between the voltage peak value and the front time value;

that the electronic processing device is configured to establish a multiplication factor from a stored lock-up table with the voltage peak value and the steepness value as input values in the look-up table; and that the electronic processing device is configured to establish the maximum-voltage value as the product of the voltage peak value and the multiplication factor.

9. The monitoring arrangement according to claim 1, wherein the analogue measuring circuit includes an inductive sensing member for sensing current impulses passing through the conductor element.

10. A method for establishing monitoring data related to a surge arrester which is connected to a live wire of a power network at a connection point on the live wire in order to protect an electrical apparatus of the power network against incoming surges, wherein the method includes the steps of:

a) producing an analogue current signal by means of an analogue measuring circuit which senses current impulses passing through a conductor element electrically connected to ground and to the surge arrester, wherein said analogue current signal represents a current impulse which passes through the surge arrester and the conductor element and which is associated with an incoming surge in the live wire;

b) sampling the analogue current signal from the analogue measuring circuit by means of an analog-to-digital converter in order to convert this analogue current signal into digital signals representing said current impulse;

c) establishing, based on said digital signals, a voltage peak value representing the highest voltage at said connection point during the incoming surge; and d) establishing, based on said voltage peak value and by means of a calculation model or look-up table, a maximum-voltage value representing an estimated maximum voltage across the electrical apparatus during the incoming surge in question.

11. The method according to claim 10, wherein the analog-to-digital converter samples the analogue current signal from the analogue measuring circuit at a sampling frequency of 20 MHz or higher.

12. The method according to claim 10, wherein said maximum-voltage value is stored on a data storage medium.

13. The method according to claim 10, wherein a front time value and a current peak value representing the front time and the highest current, respectively, of the current impulse is established based on said digital signals for the current impulse, wherein said front time value and current peak value are taken into account when establishing the voltage peak value.

14. The method according to claim 13, wherein:

that a first voltage value, which represents the highest discharge voltage across the surge arrester during the incoming surge in question as derived from the voltage-current characteristic of the surge arrester, is established based on said front time value and current peak value and the voltage-current characteristic of the surge arrester;

that a second voltage value, which represents the highest inductance-related voltage drop occurring in the electric path from the connection point to the surge arrester, across the surge arrester and from the surge arrester to ground during the incoming surge in question, is established based on said front time value and current peak value and an inductance value representing the estimated total inductance of said electric path; and that the voltage peak value is established as the sum of the first voltage value and the second voltage value.

15. The method according to claim 13, wherein:

that a steepness value, which represents the steepness of the incoming surge, is established as the quotient between the voltage peak value and the front time value;

that a multiplication factor is established from a stored lock-up table using the voltage peak value and the steepness value as input values in the look-up table; and that the maximum-voltage value is established as the product of the voltage peak value and the multiplication factor.

16. The monitoring arrangement according to claim 2, wherein:

that the monitoring arrangement includes a base module and an auxiliary module detachably mountable to the base module;

that the conductor element and the analogue measuring circuit are arranged in the base module;

that the analog-to-digital converter and the electronic processing device are arranged in the auxiliary module;

that the base module includes a first connector member, which is connected to the analogue measuring circuit; and that the auxiliary module includes a second connector member, which is connected to the analog-to-digital converter, wherein the second connector member is configured to be engaged with the first connector member when the auxiliary module is mounted to the base module to thereby allow the analog-to-digital converter to receive said analogue measuring signals from the analogue measuring circuit via the first and second connector members.

17. The monitoring arrangement according to claim 2, wherein the monitoring arrangement includes a data storage medium for storing the maximum-voltage values established by the electronic processing device.

18. The monitoring arrangement according to claim 2, wherein:

that the electronic processing device is configured to establish a steepness value representing the steepness of the incoming surge, wherein the electronic processing device is configured to establish the steepness value as the quotient between the voltage peak value and the front time value;

that the electronic processing device is configured to establish a multiplication factor from a stored lock-up table with the voltage peak value and the steepness value as input values in the look-up table; and that the electronic processing device is configured to establish the maximum-voltage value as the product of the voltage peak value and the multiplication factor.

19. The method according to claim 11, wherein said maximum-voltage value is stored on a data storage medium.

20. The method according to claim 14, wherein:

that a steepness value, which represents the steepness of the incoming surge, is established as the quotient between the voltage peak value and the front time value;

that a multiplication factor is established from a stored lock-up table using the voltage peak value and the steepness value as input values in the look-up table; and that the maximum-voltage value is established as the product of the voltage peak value and the multiplication factor.

21. The method according to claim 10, wherein the analog-to-digital converter samples the analogue current signal from the analogue measuring circuit at a sampling frequency of 35-45 MHz.

\* \* \* \* \*